United States Patent
Lin et al.

(10) Patent No.: US 9,312,013 B1
(45) Date of Patent: Apr. 12, 2016

(54) CONFIGURATION METHOD OF ERASE OPERATION, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); Yu-Cheng Hsu, Yilan County (TW); An-Cheng Liu, Taipei (TW); Siu-Tung Lam, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 14/693,876

(22) Filed: Apr. 23, 2015

(30) Foreign Application Priority Data

Feb. 17, 2015 (TW) .............................. 104105631 A

(51) Int. Cl.
*G11C 16/04* (2006.01)
*G11C 16/14* (2006.01)
*G11C 16/34* (2006.01)

(52) U.S. Cl.
CPC ............ *G11C 16/14* (2013.01); *G11C 16/3445* (2013.01); *G11C 16/3495* (2013.01)

(58) Field of Classification Search
CPC .... G11C 16/10; G11C 16/06; G11C 2216/30; G11C 7/10; G11C 7/1042; G11C 7/22; G11C 5/02; G11C 11/56; G11C 11/5628; G11C 11/5635; G11C 11/5642; G11C 16/00; G11C 16/3445
USPC ............. 365/189.07, 185.03, 185.11, 185.33, 365/189.05, 189.15, 63
See application file for complete search history.

(56) References Cited

U.S. PATENT DOCUMENTS

2012/0011301 A1*  1/2012  Goss ..................... G11C 16/10
                                                                711/103

* cited by examiner

*Primary Examiner* — Thong Q Le
(74) *Attorney, Agent, or Firm* — Jianq Chyun IP Office

(57) ABSTRACT

A configuration method of erase operation, a memory controlling circuit unit, and a memory storage device are provided. The method includes: determining whether a first use state of a first physical unit conforms to a first default state; and if the first use state conforms to the first default state, adjusting a first erase operation corresponding to the first physical unit from using a first mode to a second mode. Thereby, a threshold voltage distribution of memory cells in an erase state may be maintained in a proper range.

25 Claims, 10 Drawing Sheets

CONFIGURATION METHOD OF ERASE OPERATION, MEMORY CONTROLLING CIRCUIT UNIT AND MEMORY STORAGE DEVICE

CROSS-REFERENCE TO RELATED APPLICATION

This application claims the priority benefit of Taiwan application serial no. 104105631, filed on Feb. 17, 2015. The entirety of the above-mentioned patent application is hereby incorporated by reference herein and made a part of this specification.

BACKGROUND

1. Technology Field

The invention relates to a method for memory management and more particularly relates to a configuration method of erase operation, a memory controlling circuit unit, and a memory storage device.

2. Description of Related Art

The market of digital cameras, mobile phones, and MP3 players has expanded rapidly in recent years, resulting in consumers' escalating demand for storage media. The characteristics of data non-volatility, low power consumption, compact size, and no mechanical structure make the rewritable non-volatile memory module (e.g. flash memory) ideal for being built in the portable multi-media devices as cited above.

However, wear degree of memory cells in a rewritable non-volatile memory module gets worse as the time of use of the rewritable non-volatile memory module increases. In such a situation, continuous use of the rewritable non-volatile memory module may reduce the efficiency of the rewritable non-volatile memory module, or even cause adverse effects on the erase operation of the memory cells.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY OF THE INVENTION

The invention provides a configuration method of erase operation, a memory controlling circuit unit, and a memory storage device for reducing influence on an erase operation due to wear of memory cells.

An exemplary embodiment of the invention provides a configuration method of erase operation for a rewritable non-volatile memory module which includes a plurality of physical units. The configuration method of erase operation includes: determining whether a first use state of a first physical unit of the physical units conforms to a first default state; adjusting a first erase operation corresponding to the first physical unit from using a first mode to a second mode if the first use state conforms to the first default state, wherein the first mode and the second mode are different; and maintaining the first erase operation in using the first mode if the first use state does not conform to the first default state.

An exemplary embodiment of the invention provides a memory storage device including a connection interface unit, a rewritable non-volatile memory module, and a memory controlling circuit unit. The connection interface unit is configured to couple to a host system. The rewritable non-volatile memory module includes a plurality of physical units. The memory controlling circuit unit is coupled to the connection interface unit and the rewritable non-volatile memory module. The memory controlling circuit unit is configured to determine whether a first use state of a first physical unit of the physical units conforms to a first default state. The memory controlling circuit unit is further configured to transmit an erase mode adjustment command if the first use state conforms to the first default state, wherein the erase mode adjustment command instructs to adjust a first erase operation corresponding to the first physical unit from using a first mode to a second mode, where the first mode and the second mode are different. The memory controlling circuit unit is further configured to maintain the first erase operation in using the first mode if the first use state does not conform to the first default state.

An exemplary embodiment of the invention provides a memory controlling circuit unit for controlling a rewritable non-volatile memory module. The rewritable non-volatile memory module includes a plurality of physical units. The memory controlling circuit unit includes a host interface, a memory interface, and a memory management circuit. The host interface is configured to couple to a host system. The memory interface is configured to couple to the rewritable non-volatile memory module. The memory management circuit is coupled to the host interface and the memory interface, wherein the memory management circuit is configured to determine whether a first use state of a first physical unit of the physical units conforms to a first default state. The memory management circuit is further configured to transmit an erase mode adjustment command if the first use state conforms to the first default state, wherein the erase mode adjustment command instructs to adjust a first erase operation corresponding to the first physical unit from using a first mode to a second mode, where the first mode and the second mode are different. The memory management circuit is further configured to maintain the first erase operation in using the first mode if the first use state does not conform to the first default state.

Based on the above, the invention may adjust an operation mode of a corresponding erase operation according to the wear degree of the physical units in the rewritable non-volatile memory module. Thereby, the invention may adjust the threshold voltage distribution of the memory cells in the erase state to an appropriate range, so as to reduce the probability of reading erroneous data when reading data from the memory cells and/or preventing increase of the time required for programming the memory cells.

To make the aforementioned and other features and advantages of the invention more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings

DESCRIPTION OF THE EMBODIMENTS

Figure 1:
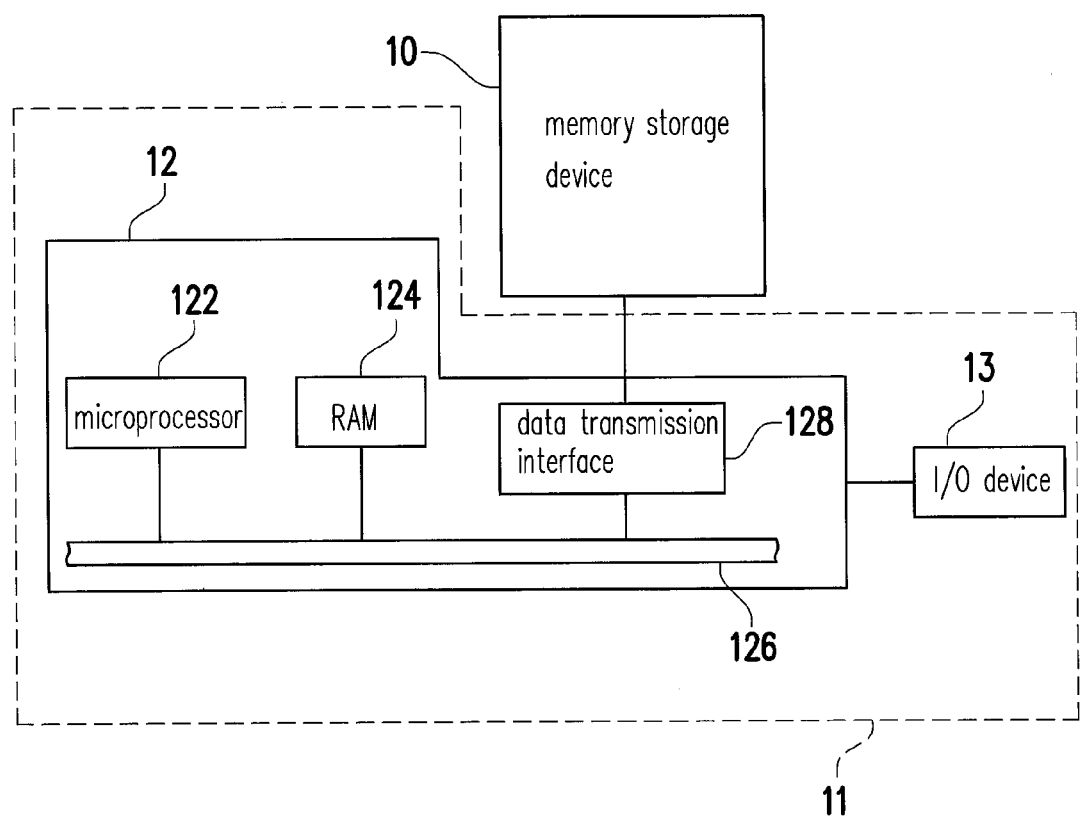
FIG. 1 is a diagram showing a host system and a memory storage device according to an exemplary embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also called a memory storage system) includes a rewritable non-volatile memory module and a controller (also called a controlling circuit). The memory storage device is usually used together with a host system, such that the host system can write data into or read data from the memory storage device.

Figure 2:
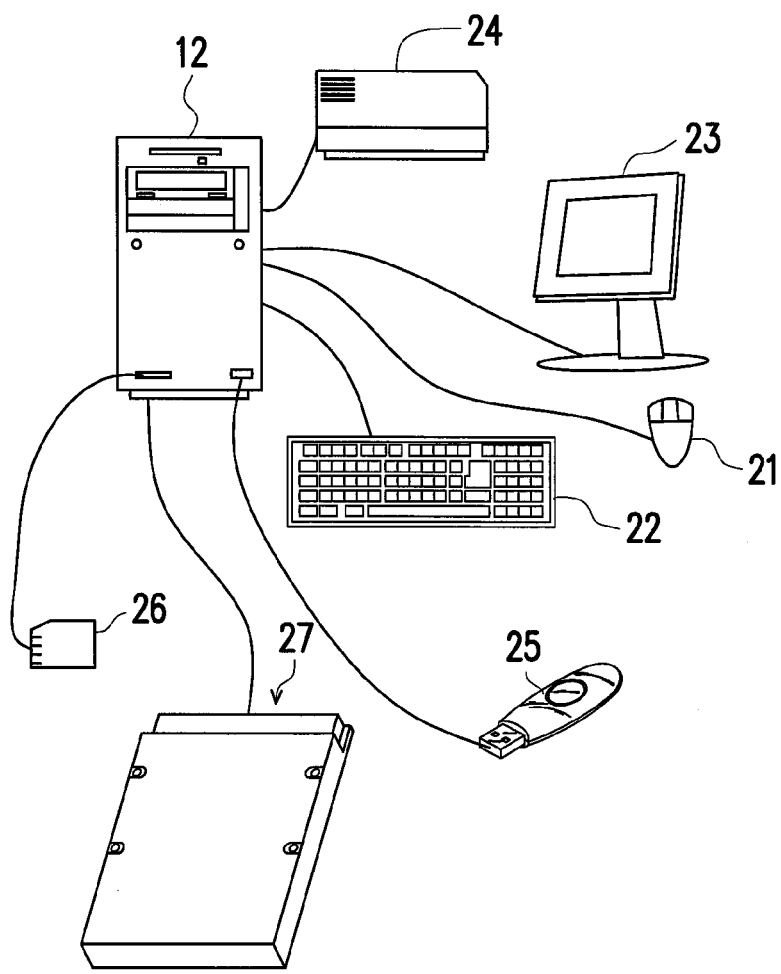
FIG. 2 is a diagram showing a computer, an input/output device, and a memory storage device according to an exemplary embodiment of the invention.

FIG. 1 is a diagram showing the host system and the memory storage device according to an exemplary embodiment of the invention. FIG. 2 is a diagram showing a computer, an input/output device, and the memory storage device according to an exemplary embodiment of the invention.

Referring to FIG. 1, generally a host system 11 includes a computer 12 and an input/output (I/O) device 13. The computer 12 includes a microprocessor 122, a random access memory (RAM) 124, a system bus 126, and a data transmission interface 128. The I/O device 13 includes a mouse 21, a keyboard 22, a display 23, and a printer 24 as shown in FIG. 2. It may be understood that the devices illustrated in FIG. 2 are not intended to limit the I/O device 13, and the I/O device 13 may further include other devices.

According to an exemplary embodiment of the invention, the memory storage device 10 is coupled to other elements of the host system 11 through the data transmission interface 128. Through operations of the microprocessor 122, the random access memory 124 and the I/O device 13, data is written to or read from the memory storage device 10. For instance, the memory storage device 10 may be a rewritable non-volatile memory storage device, such as a flash drive 25, a memory card 26, or a solid state drive (SSD) 27, as shown in FIG. 2.

Figure 3:
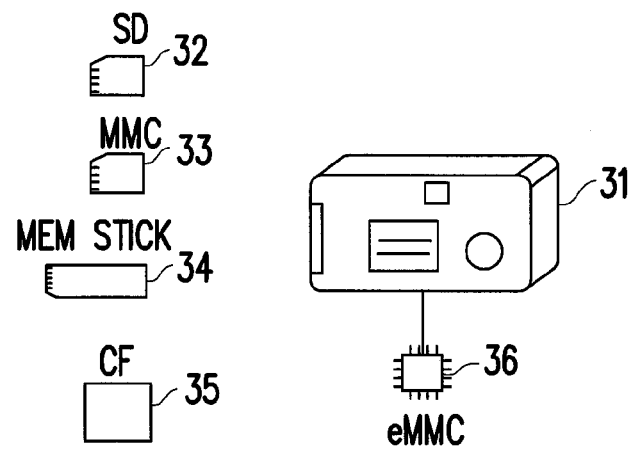
FIG. 3 is a diagram showing a host system and a memory storage device according to an exemplary embodiment of the invention.

FIG. 3 is a diagram showing the host system and the memory storage device according to an exemplary embodiment of the invention.

Generally, the host system 11 can substantially be any system collocated with the memory storage device 10 for storing data. Even though the host system 11 is described as a computer system in this exemplary embodiment, in another exemplary embodiment of the invention, the host system 11 may be a digital camera, a video camera, a communication device, an audio player, or a video player. For example, if the host system is a digital camera (video camera) 31, the rewritable non-volatile memory storage device is then a secure digital (SD) card 32, a multi media card (MMC) 33, a memory stick 34, a compact flash (CF) card 35, or an embedded storage device 36 (as shown in FIG. 3). The embedded storage device 36 includes an embedded MMC (eMMC). It may be mentioned that the eMMC is directly coupled to a substrate of the host system.

Figure 4:
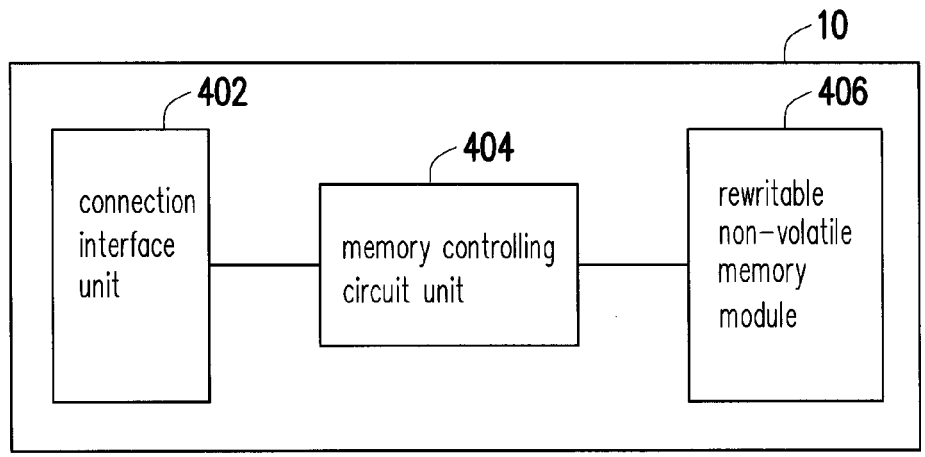
FIG. 4 is a schematic block diagram of the memory storage device shown in FIG. 1.

FIG. 4 is a schematic block diagram of the memory storage device shown in FIG. 1.

Referring to FIG. 4, the memory storage device 10 includes a connection interface unit 402, a memory controlling circuit unit 404, and a rewritable non-volatile memory module 406.

In this exemplary embodiment, the connection interface unit 402 is compatible to the Serial Advanced Technology Attachment (SATA) standard. However, it should be noted that the invention is not limited thereto, and the connection interface unit 402 may also comply with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the Memory Stick (MS) interface standard, the Multi Media Card (MMC) interface standard, the Embedded Multimedia Card (eMMC) interface standard, the Universal Flash Storage (UFS) interface standard, the Compact Flash (CF) interface standard, the Integrated Device Electronics (IDE) interface standard, or other suitable standards. The connection interface unit 402 may be packaged in a chip together with the memory controlling circuit unit 404, or the connection interface unit 402 may be disposed outside a chip including the memory controlling circuit unit 404.

The memory controlling circuit unit 404 is configured for executing a plurality of logic gates or control commands implemented in a hardware form or in a firmware form and perform various operations, such as data writing, data reading, or data erasing, in the rewritable non-volatile memory module 406 according to a command of the host system 11.

The rewritable non-volatile memory module 406 is coupled to the memory controlling circuit unit 404 for storing data written by the host system 11. The rewritable non-volatile memory module 406 may be a Single Level Cell (SLC) NAND flash memory module (i.e. a flash memory module in which one memory cell stores 1 bit of data), a Multi Level Cell (MLC) NAND flash memory module (i.e. a flash memory module in which one memory cell stores 2 bits of data), a Triple Level Cell (TLC) NAND flash memory module (i.e. a flash memory module in which one memory cell stores 3 bits of data), other types of flash memory modules, or other memory modules having the same characteristics.

Figure 5:
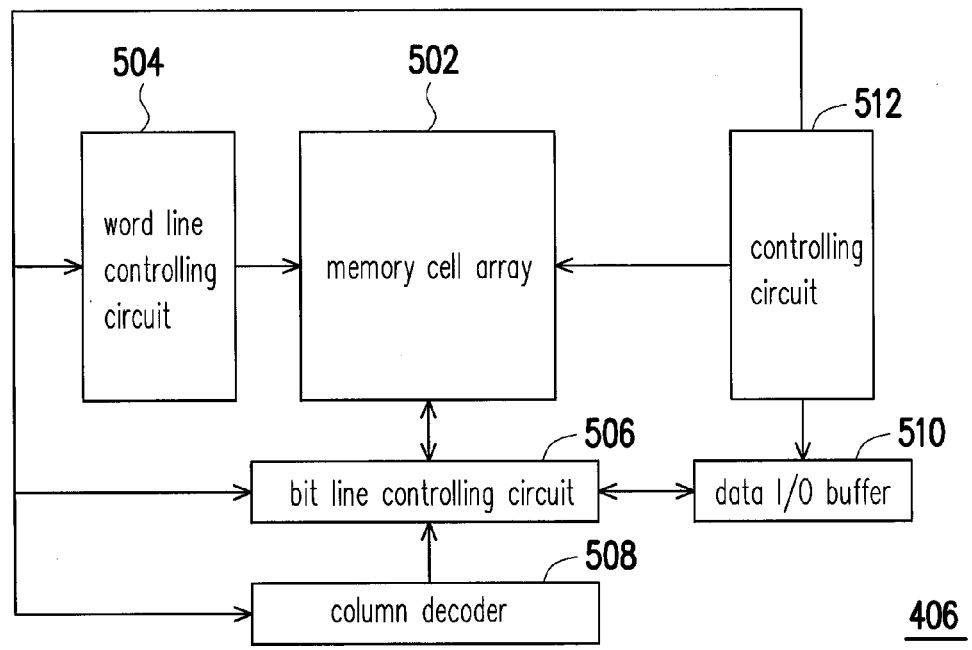
FIG. 5 is a schematic block diagram showing a rewritable non-volatile memory module according to an exemplary embodiment of the invention.

FIG. 5 is a schematic block diagram showing the rewritable non-volatile memory module according to an exemplary embodiment of the invention.

Referring to FIG. 5, the rewritable non-volatile memory module 406 includes a memory cell array 502, a word line controlling circuit 504, a bit line controlling circuit 506, a column decoder 508, a data input/output (I/O) buffer 510, and a controlling circuit 512.

The memory cell array 502 includes a plurality of memory cells for storing data. The memory cells are arranged in an array and disposed on intersections of a plurality of word lines and a plurality of bit lines. When receiving a write command or a read command from the memory controlling circuit unit 404, the controlling circuit 512 controls the word line controlling circuit 504, the bit line controlling circuit 506, the column decoder 508, and the data I/O buffer 510 to write data to or read data from the memory cell array 502. Moreover, the word line controlling circuit 504 is configured to control a voltage applied to the word lines, the bit line controlling circuit 506 is configured to control a voltage applied to the bit lines, the column decoder 508 selects a corresponding bit line according to a decoded row address in the command, and the data I/O buffer 510 is configured to store data temporarily.

Each memory cell in the memory cell array 502 stores one or more bits by change of a threshold voltage. Specifically, a charge trapping layer exists between a control gate of each memory cell and a channel. By applying a write voltage to the control gate, an electron amount of the charge trapping layer is changed, thereby changing the threshold voltage of the memory cell. The process of changing the threshold voltage is also called "writing data to the memory cell" or "programming the memory cell". Each memory cell of the memory cell array 502 has a plurality of storage states according to the change of the threshold voltage. The storage state of the memory cell can be determined by applying a reading voltage, thereby obtaining the one or more bits stored in the memory cell.

The memory cell array 502 includes a plurality of physical erase units. The physical erase units may belong to the same or different memory dies. Take a NAND flash memory as an example, one physical erase unit includes a plurality of NAND strings. Each NAND string includes a plurality of transistors connected in series.

Figure 6:
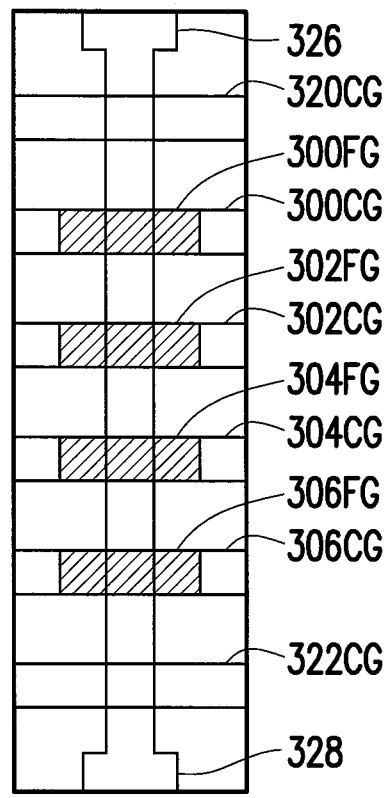
FIG. 6 is a top view of a NAND string according to an exemplary embodiment of the invention.
Figure 7:
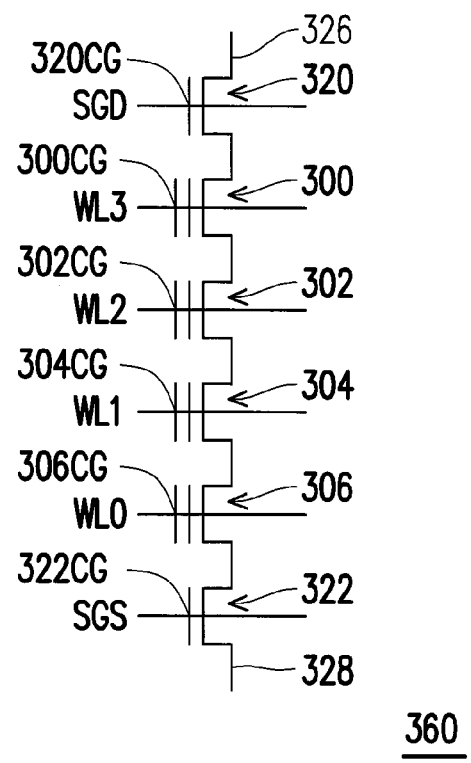
FIG. 7 is an equivalent circuit diagram showing a NAND string according to an exemplary embodiment of the invention.

FIG. 6 is a top view of one NAND string according to an exemplary embodiment of the invention. FIG. 7 is an equivalent circuit diagram showing one NAND string according to an exemplary embodiment of the invention.

Referring to FIG. 6 and FIG. 7, a NAND string 360 includes transistors 320, 300, 302, 304, 306, and 322. A line between a contact point 326 and a contact point 328 is also called one bit line. A control gate 320CG on the transistor 320 is coupled to a select line SGD; a control gate 300CG on the transistor 300 is coupled to a word line WL3; a control gate 302CG on the transistor 302 is coupled to a word line WL2; a control gate 304CG on the transistor 304 is coupled to a word line WL1; a control gate 306CG on the transistor 306 is coupled to a word line WL0; and a control gate 322CG on the transistor 322 is coupled to a select line SGS. Each of the transistors 300, 302, 304, and 306 further includes a charge trapping layer. The charge trapping layer is provided for storing electrons or holes. In this exemplary embodiment, the charge trapping layer is called a floating gate, and a material thereof includes doped polysilicon. Nevertheless, in another exemplary embodiment, the charge trapping layer may include a silicon oxide-silicon nitride-silicon oxide composite layer, or other materials that can be used for storing electrons or holes. It should be noted that the invention is not limited to the above. In the exemplary embodiment of FIG. 3, the transistor 300 includes a floating gate 300FG; the transistor 302 includes a floating gate 302FG; the transistor 304 includes a floating gate 304FG; and the transistor 306 includes a floating gate 306FG. Here, the transistors 300, 302, 304 and 306 are also called memory cells.

Figure 8:
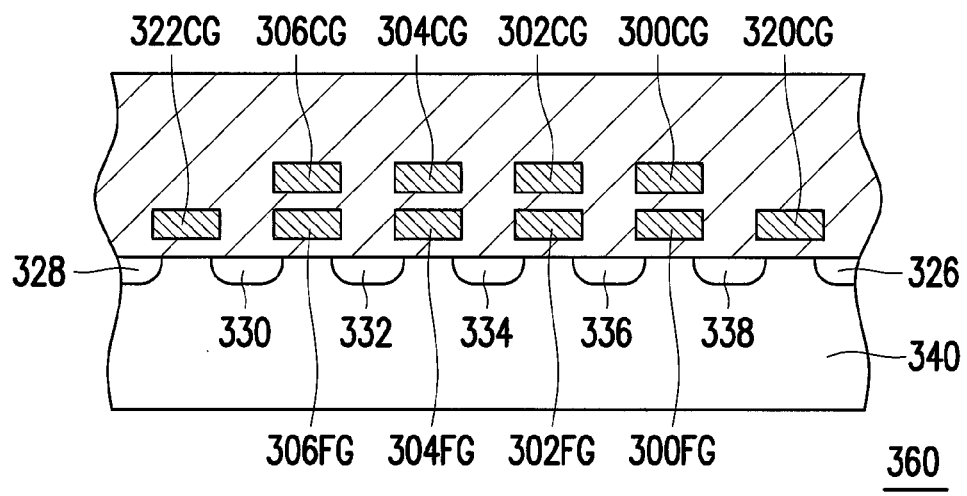
FIG. 8 is a side view of a NAND string according to an exemplary embodiment of the invention.

FIG. 8 is a side view of the NAND string according to an exemplary embodiment of the invention. Referring to FIG. 6 to FIG. 8, the NAND string 360 is disposed on a substrate 340. The control gates 300CG, 302CG, 304CG, and 306CG are respectively disposed on the floating gates 300FG, 302FG, 304FG, and 306FG. A dielectric layer is disposed between the control gates 300CG, 302CG, 304CG, and 306CG and the floating gates 300FG, 302FG, 304FG, and 306FG. An oxide layer is disposed between the floating gates 300FG, 302FG, 304FG, and 306FG and the substrate 340. In FIG. 8, the adjacent transistors share doped polysilicon layers 330, 332, 334, 336, and 338, and one polysilicon layer forms a source or a drain of one transistor. When writing data (also known as programming) to the transistors 300, 302, 304, and 306, a proper voltage is applied to the control gates 320CG and 322CG, such that the transistor 320 and the transistor 322 are turned on, and a current exists between the contact point 326 and the contact point 328. A write voltage is applied to the control gate of the transistor that is to be programmed (here, the control gate 302CG is described as an example), such that the electrons or holes in the current move to the floating gate 302FG. When the electrons or holes are injected into the floating gate 302FG, the threshold voltage of the transistor 302 changes, equivalent to storing one or more bits. It may be noted that, in other exemplary embodiments, the NAND string 360 may include more memory cells. The invention is not intended to limit the number of the memory cells in one NAND string. In addition, the disclosure of FIG. 6 to FIG. 8 is merely an example. The invention is not intended to limit the structure of the memory cells in the rewritable non-volatile memory module 406 or the coupling relationship between circuits. For example, in one exemplary embodiment, the memory cells may be stacked on one another to form a three-dimensional flash memory.

Figure 9:
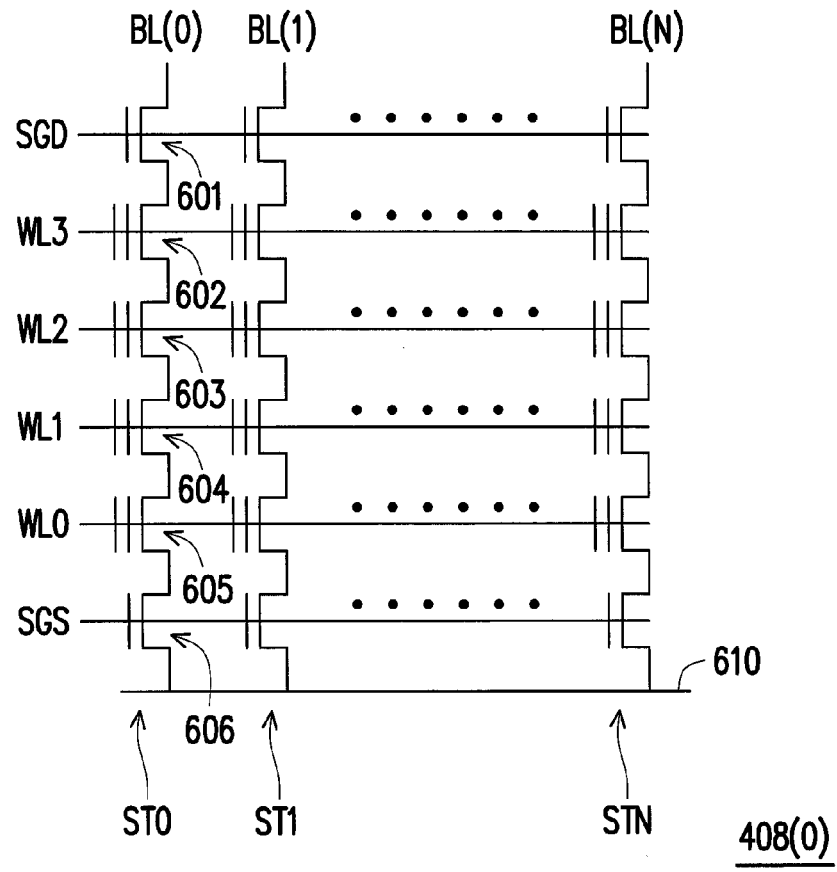
FIG. 9 is a diagram showing a physical erase unit according to an exemplary embodiment of the invention.

FIG. 9 is a diagram showing one physical erase unit according to an exemplary embodiment of the invention.

Referring to FIG. 9, it is assumed that the memory cell array 502 includes a physical erase unit 408(0). The physical erase unit 408(0) includes a plurality of NAND strings ST0-STN. The NAND string ST0 includes transistors 601 and 606 and memory cells 602-605. The NAND strings ST0-STN are similar to the NAND string 360 of FIG. 7. Thus, details thereof are not repeated hereinafter. The physical erase unit 408(0) further includes a plurality of word lines WL0-WL3 and a plurality of bit lines BL(0)-BL(N). Generally, each memory cell is located on one word line and one bit line. The memory cells on the same word line form one or a plurality of physical programming units. If each memory cell is capable of storing x bits, the memory cells on the same word line form at least x physical programming units, wherein x is a positive integer. If the positive integer x is greater than 1, the x physical programming units on the same word line may be categorized as a lower physical programming unit and an upper physical programming unit. However, it should be noted that the invention is not intended to limit the value of the positive integer x. Generally, a writing speed of the lower physical programming unit is higher than a writing speed of the upper physical programming unit. In this exemplary embodiment, the physical programming unit is the smallest unit for programming. In other words, each physical programming unit is the smallest unit for writing data. For example, the physical programming unit is a physical page or a physical sector. If the physical programming unit is one physical page, each of the physical programming units usually includes a data bit region and a redundant bit region. The data bit region includes a plurality of physical sectors for storing user data, and the redundant bit region is configured for storing system data (e.g. an error correcting code). In this exemplary embodiment, each data bit region includes 32 physical sectors, and each physical sector is 512 bytes (B). However, in other exemplary embodiments, the data bit region may include 8, 16, or more or fewer physical sectors. The invention is not intended to limit the sizes and the number of the data bit region or the physical sectors.

Further, the NAND strings ST0-STN are coupled to a source line 610. When erasing the physical erase unit 408(0), an erase voltage is applied to the substrate of the physical erase unit 408(0), such that the electrons or holes in all the floating gates of the physical erase unit 408(0) leave the floating gates they belong to. In this exemplary embodiment, the physical erase unit is the smallest unit for erasing. That is to say, each physical erase unit has a minimum number of memory cells for being erased together. The physical erase unit is a physical block, for example. Moreover, in an exemplary embodiment, when erasing the physical erase unit 408(0), a source voltage is applied to the NAND strings ST0-STN through the source line 610, equivalent to providing a negative voltage to the control gate of each transistor in the physical erase unit 408(0).

Figure 10:
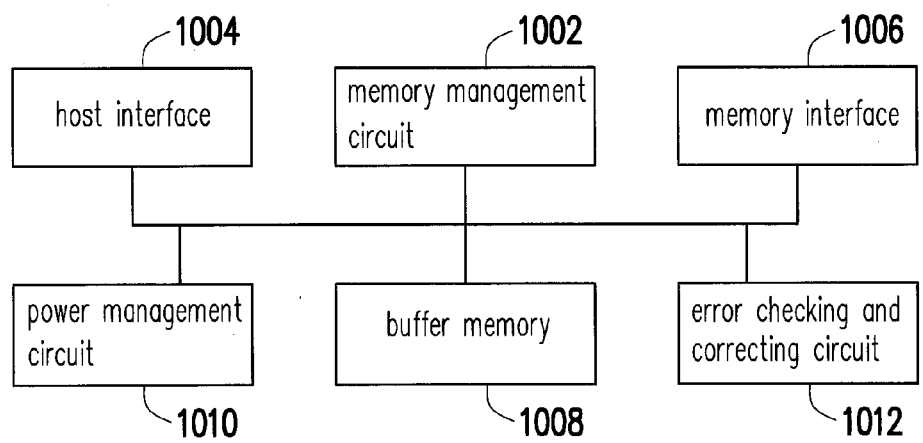
FIG. 10 is a schematic block diagram showing a memory controlling circuit unit according to an exemplary embodiment of the invention.

FIG. 10 is a schematic block diagram showing a memory controlling circuit unit according to an exemplary embodiment of the invention.

Referring to FIG. 10, the memory controlling circuit unit 404 includes a memory management circuit 1002, a host interface 1004, and a memory interface 1006.

The memory management circuit 1002 is configured for controlling an overall operation of the memory controlling circuit unit 404. Specifically, the memory management circuit 1002 has a plurality of control commands. When the memory storage device 10 is operated, the control commands are executed to perform various operations such as data writing, data reading, and data erasing. The following description of the operation of the memory management circuit 1002 is equivalent to describing the operation of the memory controlling circuit unit 404.

In this exemplary embodiment, the control commands of the memory management circuit 1002 are implemented in a firmware form. For instance, the memory management circuit 1002 has a microprocessor unit (not shown) and a read-only memory (not shown), and the control commands are burnt into the read-only memory. When the memory storage device 10 is operated, the control commands are executed by the microprocessor unit for performing various data operations, such as data writing, data reading, and data erasing.

According to another exemplary embodiment of the invention, the control commands of the memory management circuit 1002 may also be stored in a specific region (for example, a system region in the memory module exclusively used for storing system data) of the rewritable non-volatile memory module 406 in the form of program codes. Moreover, the memory management circuit 1002 has the microprocessor unit (not shown), the read-only memory (not shown), and a random access memory (not shown). In particular, the read-only memory has a boot code. When the memory controlling circuit unit 404 is enabled, the boot code is first executed by the microprocessor unit for loading the control commands stored in the rewritable non-volatile memory module 406 to the random access memory of the memory management circuit 1002. Afterwards, the microprocessor unit executes the control commands for various data operations such as data writing, data reading, and data erasing.

Additionally, in another exemplary embodiment, the control commands of the memory management circuit 1002 may be implemented in a hardware form. For example, the memory management circuit 1002 includes a microcontroller, a memory cell management circuit, a memory write circuit, a memory read circuit, a memory erase circuit, and a data processing circuit. The memory cell management circuit, the memory write circuit, the memory read circuit, the memory erase circuit, and the data processing circuit are coupled to the microcontroller. The memory cell management circuit is configured for managing the physical erase units of the rewritable non-volatile memory module 406; the memory write circuit is configured for issuing a write command to the rewritable non-volatile memory module 406 in order to write data to the rewritable non-volatile memory module 406; the memory read circuit is configured for issuing a read command to the rewritable non-volatile memory module 406 in order to read data from the rewritable non-volatile memory module 406; the memory erase circuit is configured for issuing an erase command to the rewritable non-volatile memory module 406 in order to erase data from the rewritable non-volatile memory module 406; and the data processing circuit is configured for processing both the data to be written to the rewritable non-volatile memory module 406 and the data read from the rewritable non-volatile memory module 406.

The host interface 1004 is coupled to the memory management circuit 1002 and configured for receiving and identifying commands and data transmitted from the host system 11. In other words, the commands and data sent by the host system 11 are transmitted to the memory management circuit 1002 through the host interface 1004. In this exemplary embodiment, the host interface 1004 is compatible to the SATA standard. However, it should be understood that the invention is not limited thereto, and the host interface 1004 may also be compatible to a PATA standard, an IEEE 1394 standard, a PCI Express standard, a USB standard, a SD standard, a UHS-I standard, a UHS-II standard, a MS standard, a MMC standard, an eMMC standard, a UFS standard, a CF standard, an IDE standard, or other suitable standards for data transmission.

The memory interface 1006 is coupled to the memory management circuit 1002 for accessing the rewritable non-volatile memory module 406. In other words, the data to be written to the rewritable non-volatile memory module 406 is converted to a format acceptable to the rewritable non-volatile memory module 406 by the memory interface 1006. Specifically, when the memory management circuit 1002 is to access the rewritable non-volatile memory module 406, the memory interface 1006 transmits corresponding command sequences. The command sequences may include one or more signals or data on the bus. For example, a read command sequence includes information, such as identification code and memory address, of the reading.

In an exemplary embodiment, the memory controlling circuit unit 404 further includes a buffer memory 1008, a power management circuit 1010, and an error checking and correcting (ECC) circuit 1012.

The buffer memory 1008 is coupled to the memory management circuit 1002 and configured for temporarily storing data and commands from the host system 11 or data from the rewritable non-volatile memory module 406.

The power management circuit 1010 is coupled to the memory management circuit 1002 and configured for controlling the power of the memory storage device 10.

The error checking and correcting (ECC) circuit 1012 is coupled to the memory management circuit 1002 and configured for executing an error checking and correcting procedure to ensure the correctness of data. To be more specific, when the memory management circuit 1002 receives a write command from the host system 11, the error checking and correcting (ECC) circuit 1012 generates an error correcting (ECC) code and/or an error detecting code (EDC) for the data corresponding to the write command, and the memory management circuit 1002 writes the data corresponding to the write command and the corresponding error correcting code and/or the error detecting code to the rewritable non-volatile memory module 406. Afterward, when the memory management circuit 1002 reads the data from the rewritable non-volatile memory module 406, the corresponding error correcting code and/or the error detecting code is also read simultaneously, and the error checking and correcting (ECC) circuit 1012 executes the error checking and correcting procedure for the read data based on the error correcting code and/or the error detecting code.

Figure 11:
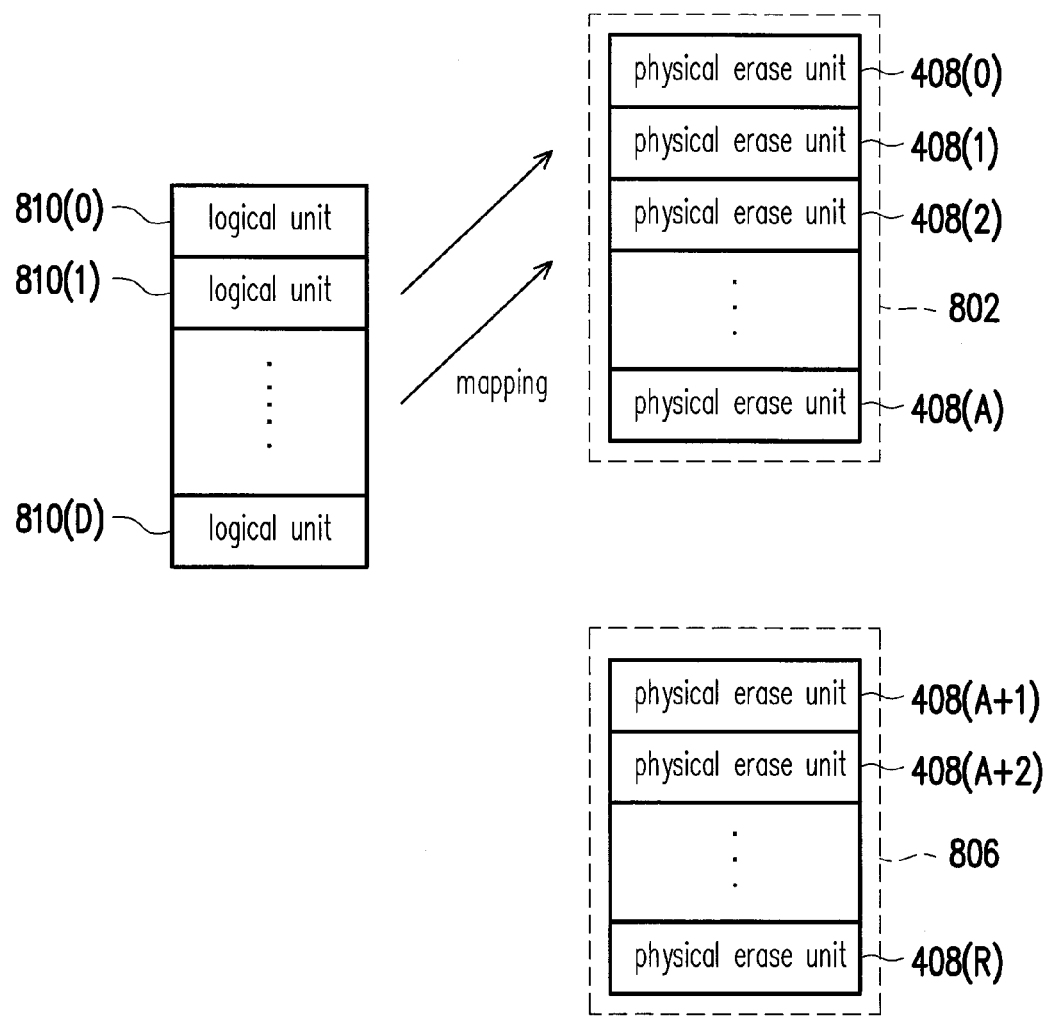
FIG. 11 is a diagram showing management of a rewritable non-volatile memory module according to an exemplary embodiment of the invention.

FIG. 11 is a diagram showing management of the rewritable non-volatile memory module according to an exemplary embodiment of the invention. It may be understood that terms, such as "select," "group," "divide," "associate," and so forth, are logical concepts which describe operations on the physical erase units of the rewritable non-volatile memory module 406. That is, the physical erase units of the rewritable non-volatile memory module are logically operated, and the actual positions of the physical erase units are not changed.

Referring to FIG. 11, in this exemplary embodiment, it is assumed that the rewritable non-volatile memory module 406 includes physical erase units 408(0)-408(R). The memory management circuit 1002 logically divides the physical erase units 408(0)-408(R) into a plurality of regions, such as a storage region 802 and a system region 806.

The physical erase units of the storage region 802 are used for storing the data from the host system 11. The storage region 802 stores valid data and invalid data. For example, when the host system 11 deletes valid data, the deleted data may still be stored in the storage region 802 but marked as invalid data. Physical erase units that do not store any valid data are also called spare physical erase units. For example, the physical erase unit that has been erased becomes one spare physical erase unit. If any physical erase unit in the storage region 802 or the system region 806 is damaged, the physical erase units in the storage region 802 may be used to replace the damaged physical erase unit. If there is no available physical erase unit in the storage region 802 for replacing the damaged physical erase unit, the memory management circuit 1002 announces the entire memory storage device 10 as being in a write protect state and data cannot be written thereto. Physical erase units that store valid data are also called non-spare physical erase units.

The physical erase units in the system region 806 are used for recording the system data, which includes information related to the manufacturer and model number of a memory chip, the number of the physical erase units in the memory chip, the number of the physical programming units of each physical erase unit, and so forth.

The numbers of the physical erase units of the storage region 802 and the system region 806 may vary according to different memory specifications. In addition, it may be understood that, during the operation of the memory storage device 10, the grouping of the physical erase units to the storage region 802 and the system region 806 varies dynamically. For instance, when the physical erase unit in the system region 806 is damaged and replaced by the physical erase unit in the storage region 802, the physical erase unit that is originally grouped to the storage region 802 is associated to the system region 806.

The memory management circuit 1002 configures logical units 810(0)-810(D) to be mapped to the physical erase units 408(0)-408(A) in the storage region 802. In this exemplary embodiment, the host system 11 accesses the data in the storage region 802 through a logical address, for example. Therefore, each of the logical units 810(0)-810(D) refers to one logical address. Further, in an exemplary embodiment, each of the logical units 810(0)-810(D) may refer to a logical sector, a logical programming unit, or a logical erase unit, or may be composed of a plurality of consecutive logical addresses. Each of the logical units 810(0)-810(D) is mapped to one or more physical units. In this exemplary embodiment, one physical unit refers to one physical erase unit. In another exemplary embodiment, one physical unit may be a physical address, a physical sector, or a physical programming unit, or may be composed of a plurality of consecutive physical addresses. Nevertheless, the invention is not limited thereto. The memory management circuit 1002 records a mapping relationship between the logical units and the physical units in one or more logical-physical mapping tables. When the host system 11 reads data from or writes data to the memory storage device 10, the memory management circuit 1002 accesses data of the memory storage device 10 according to the one or more logical-physical mapping tables.

In this exemplary embodiment, an incremental step pulse erase (ISPE) model is used in an erase operation executed on the memory cells in the rewritable non-volatile memory module 406. One incremental step pulse erase model includes a plurality of erase-verification cycles. One erase-verification cycle includes an erase pulse and a verification pulse. In one erase-verification cycle, one erase pulse is applied to one physical erase unit to erase the memory cells in the physical erase unit, and one verification pulse is successively applied to this physical erase unit to verify whether the erase of the memory cells has been completed. If the erase of the memory cells has been completed, this erase operation is ended. If the erase of the memory cells is not yet completed, another erase-verification cycle may be executed.

In one erase operation, the number of executable erase-verification cycles does not exceed a maximum cycle number. For example, in an exemplary embodiment, if the number of the erase-verification cycles that have been executed in one certain erase operation has reached the maximum cycle number, this erase operation is determined as failure and the corresponding physical erase unit may be disused. Alternatively, in another exemplary embodiment, if the number of the erase-verification cycles that have been executed in one certain erase operation has reached the maximum cycle number, another erase operation using a different parameter may be executed. However, in another exemplary embodiment, each erase operation may also have different operation details and/or changes. It should be noted that the invention is not limited thereto.

Figure 12:
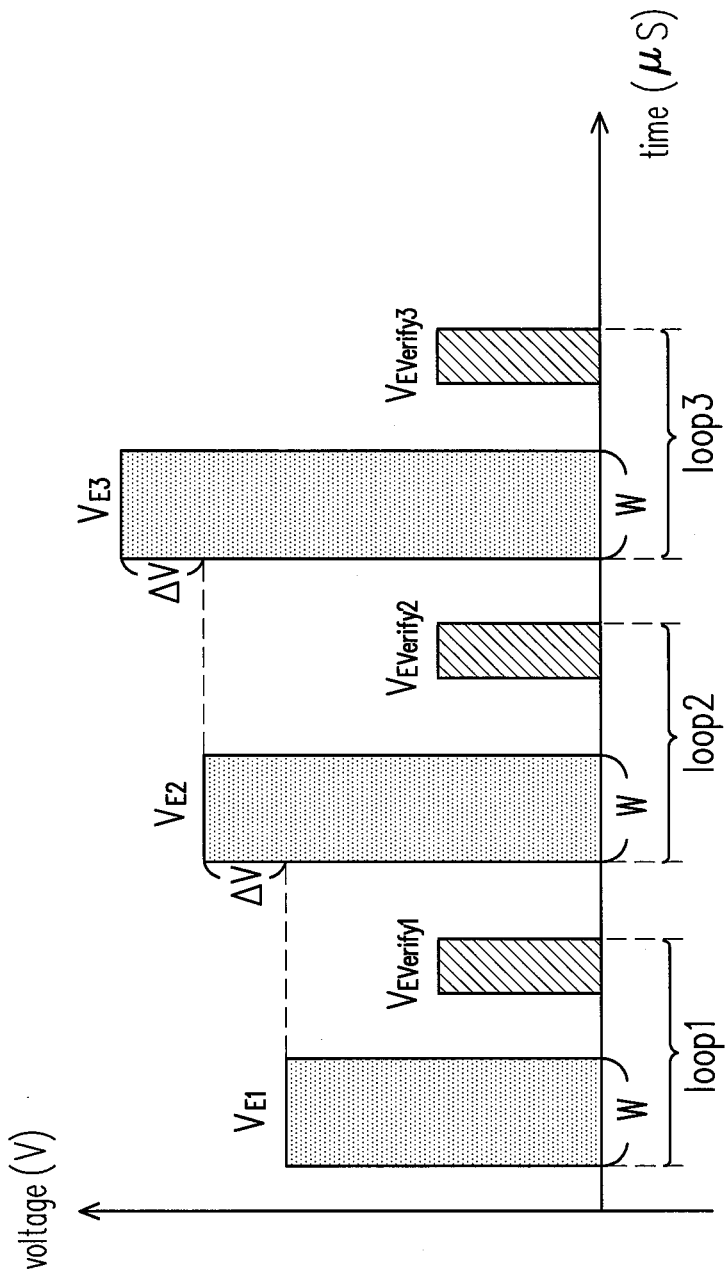
FIG. 12 is a diagram showing an incremental step pulse erase model according to an exemplary embodiment of the invention.

FIG. 12 is a diagram showing the incremental step pulse erase model according to an exemplary embodiment of the invention. In FIG. 12, the horizontal axis indicates time, e.g. μs, and the vertical axis indicates voltage.

With reference to FIG. 12, in one erase operation for one certain physical erase unit, an erase pulse $V_{E1}$ (also called an initial erase pulse) is applied to a substrate of the physical erase unit. Then, a verification pulse $V_{EVerify1}$ is applied to the memory cells of the physical erase unit. According to information the memory cells generate in response to the verification pulse $V_{EVerify1}$, whether the memory cells of the physical erase unit have been erased can be determined. If the erase of the memory cells of the physical erase unit is determined as incomplete, another erase pulse $V_{E2}$ is applied to the substrate of the physical erase unit, and another verification pulse $V_{EVerify2}$, is successively applied to the memory cells of the physical erase unit. Then, according to information the memory cells generate in response to the verification pulse $V_{EVerify2}$, if the erase of the memory cells of the physical erase unit is still determined as incomplete, another erase pulse $V_{E3}$ is applied to the substrate of the physical erase unit and another verification pulse $V_{EVerify3}$ is successively applied to the memory cells of the physical erase unit, and so forth until the erase is determined as complete or failure.

In this exemplary embodiment, the erase pulse $V_{E1}$ and the verification pulse $V_{EVerify1}$ belong to an erase-verification cycle loop1; the erase pulse $V_{E2}$ and the verification pulse $V_{EVerify2}$ belong to an erase-verification cycle loop2; and the erase pulse $V_{E3}$ and the verification pulse $V_{EVerify3}$ belong to an erase-verification cycle loop3, as shown in FIG. 12. Nevertheless, in another exemplary embodiment, more erase-verification cycles may be included in one erase operation.

In this exemplary embodiment, a voltage value of the erase pulse in one erase-verification cycle is smaller than a voltage value of the erase pulse in next erase-verification cycle. For example, the voltage value of the erase pulse $V_{E1}$ is smaller than the voltage value of the erase pulse $V_{E2}$, and the voltage value of the erase pulse $V_{E2}$ is smaller than the voltage value of the erase pulse $V_{E3}$. Generally, an incremental step pulse erase increment value is added to the voltage value of the erase pulse in one erase-verification cycle to obtain the voltage value of the erase pulse in the next erase-verification cycle. For example, an incremental step pulse erase increment value $\Delta V$ is added to the voltage value of the erase pulse $V_{E1}$ to obtain the voltage value of the erase pulse $V_{E2}$; and the incremental step pulse erase increment value $\Delta V$ is added to the voltage value of the erase pulse $V_{E2}$ to obtain the voltage value of the erase pulse $V_{E3}$.

In this exemplary embodiment, according to the information the memory cells generate in response to one certain verification pulse, if the erase operation of the physical erase unit is determined as complete, it indicates that the memory cells of the physical erase unit are in an erase state.

Figure 13:
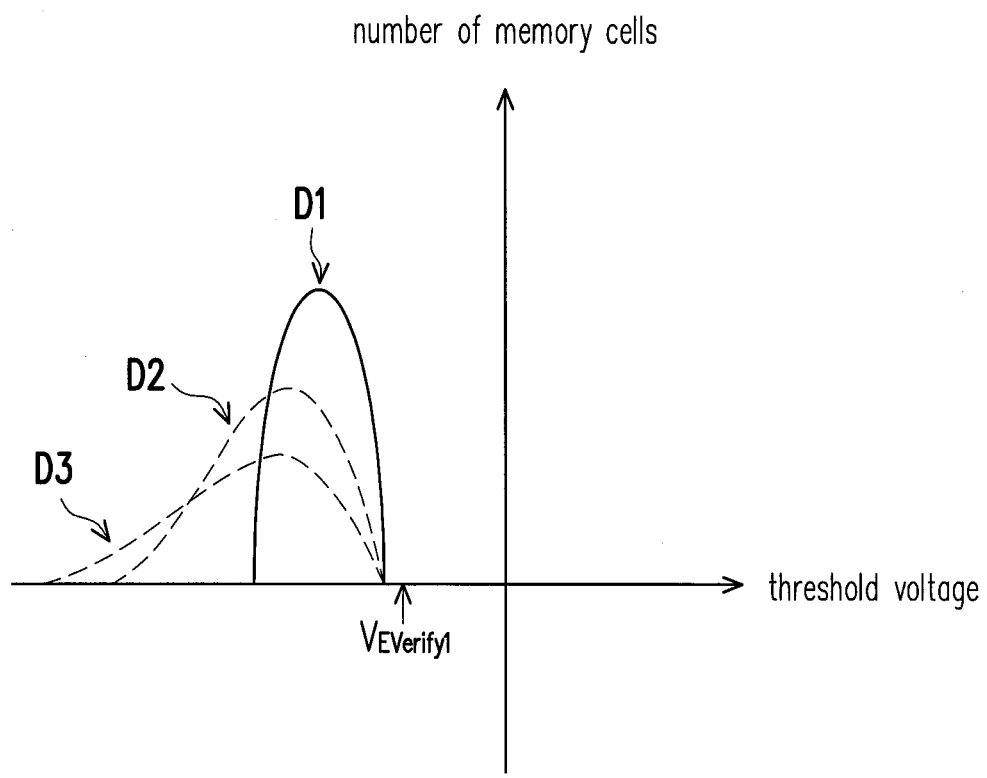
FIG. 13 is a diagram showing a threshold voltage distribution of memory cells in an erase state according to an exemplary embodiment of the invention.

FIG. 13 is a diagram showing a threshold voltage distribution of the memory cells in the erase state according to an exemplary embodiment of the invention.

With reference to FIG. 13, after the memory cells of one certain physical erase unit are erased, the threshold voltage distribution of the memory cells in the erase state is a distribution D1, for example. However, a wear degree of the memory cells in the rewritable non-volatile memory module 406 increases with the time of using the rewritable non-volatile memory module 406. The wear degree of one memory cell is related to at least one of the following: an erase count of the memory cell, a programming count of the memory cell, a reading count of the memory cell, an error bit number of the memory cell, and an error bit rate of the memory cell. For example, the wear degree of a memory cell increases as the erase count of the memory cell, the programming count of the memory cell, or the reading count of the memory cell, increases. The increase of the error bit number or the error bit rate of one memory cell may result from the increase of the wear degree of the memory cell. In addition, external factors, such as ambient temperature and/or humidity, may also affect the wear degree of the memory cell. For example, if the current ambient temperature is too high, the number of error bits or the error bit rate of the memory cells in the rewritable non-volatile memory module 406 may also increase, and this situation may also be deemed as increase of the wear degree of the memory cells.

If the wear degree of the memory cells increases, then the threshold voltage distribution of the memory cells after the memory cells are programmed or erased may be affected. Generally, a wider threshold voltage distribution of the memory cells in the erase state indicates that the wear degree of the memory cells is higher. For example, in another exemplary embodiment of FIG. 13, if the wear degree of the memory cells increases, the threshold voltage distribution of the memory cells after the memory cells are erased may change from the distribution D1 to a distribution D2 or a distribution D3. Nevertheless, the threshold voltage distribution of the memory cells in the erase state, as shown in FIG. 13, is merely an example. The memory cells may have different threshold voltage distributions in reality. Moreover, basically the threshold voltage of the memory cells in the erase state is smaller than the verification voltage $V_{EVerify1}$ that is applied in FIG. 12.

In this exemplary embodiment, one physical unit is used as the unit for assessing the wear degree of the memory cells. The wear degree of one physical unit, described in the following paragraphs, is equivalent to the wear degree of one or more memory cells of one physical unit. For example, the wear degree may refer to the wear degree of one specific memory cell or an average wear degree or a maximum wear degree of multiple memory cells. For example, the average wear degree may refer to an average, a weighted average, or a median of the wear degrees of multiple memory cells. For example, the maximum wear degree may refer to a maximum of the wear degrees of multiple memory cells.

In this exemplary embodiment, a wear degree value of one certain physical unit is used as the basis for assessing the wear degree of this physical unit. For example, a wear degree value of one certain physical unit may be determined according to at least one of the following factors: the erase count of the physical unit, the programming count of the physical unit, the reading count of the physical unit, the error bit number of the physical unit, the ambient temperature, and the ambient humidity. For example, the wear degree value of one certain physical unit may be updated instantly by the memory management circuit 1002 and recorded in a lookup table.

In this exemplary embodiment, the wear degree of every physical unit in the rewritable non-volatile memory module 406 is indicated by values with the same attribute. For example, the wear degree of every physical unit is determined according to the number of times of erase (i.e., the erase count), the number of times of programming (i.e., the programming count), or the number of times of reading (i.e., the reading count). Nevertheless, in another exemplary embodiment, the wear degrees of different physical units in the rewritable non-volatile memory module 406 may be indicated by values with different attributes. For example, for some physical units that are more frequently read, the wear degree may be indicated by the number of times of reading; and for some physical units that have higher error bit rates, the wear degree may be determined based on the error bit rate.

In this exemplary embodiment, one physical unit is one physical erase unit, for example. Nevertheless, in another exemplary embodiment, one physical unit may be a memory cell, a physical sector, or a physical programming unit, or may be composed of memory cells of a random number/distribution.

Generally, the wider the threshold voltage distribution of the memory cells in the erase state is, the wider the threshold voltage distribution of the memory cells after the memory cells are programmed (i.e. stored with data) becomes. As a result, if reading data form these memory cells, the probability of reading erroneous data increases. Moreover, as the threshold voltage distribution of the memory cells in the erase state becomes wider, the time required for programming these memory cells may also increases. According to the invention, adjustment of an operation mode of an erase operation for one physical unit is executed based on the wear degree of the physical unit. Thus, for physical units having different wear degrees, the invention is conducive to narrowing the threshold voltage distribution of the memory cells in the erase state in these physical units to reduce occurrence of the aforementioned problems.

The memory management circuit 1002 detects a use state (also called a first use state) of one certain physical unit (also called a first physical unit) in the rewritable non-volatile memory module 406. The memory management circuit 1002 determines whether the first use state conforms to a default state (also called a first default state). If the first use state conforms to the first default state, the memory management circuit 1002 transmits an erase mode adjustment command to the rewritable non-volatile memory module 406. The erase mode adjustment command includes one or more program codes or command codes. The erase mode adjustment command instructs the rewritable non-volatile memory module 406 to adjust the erase operation (also called a first erase operation) corresponding to the first physical unit from using one mode (also called a first mode) to another mode (also called a second mode), wherein the first mode and the second mode are different. For example, the memory management circuit 1002 may adjust an erase parameter to achieve adjustment of the erase operation. For example, the erase parameter refers to various parameters related to the erase operation for the first physical unit. Further, if the first use state does not conform to the first default state, the memory management circuit 1002 does not change the operation mode of the first erase operation. For example, the memory management circuit 1002 maintains the first erase operation in using the first mode. In other words, if the first use state does not conform to the first default state, the memory management circuit 1002 does not transmit the erase mode adjustment command Compared with the first mode, the erase operation executed under the second mode further narrows the threshold voltage distribution of the memory cells in the erase state.

In this exemplary embodiment, the first use state refers to a wear degree value of the first physical unit (also called the first wear degree value). The memory management circuit 1002 determines whether the first wear degree value conforms to a default wear degree value. If the first wear degree value conforms to the default wear degree value, the memory management circuit 1002 determines that the first use state conforms to the first default state. For example, if the first wear degree value is indicated by the number of times of erase (i.e., the erase count) of the first physical unit, the default wear degree value may be 3000. If the number of times of erase of the first physical unit reaches the default wear degree value, it indicates that the number of times of erase of the first physical unit reaches 3000, and in response thereto, the memory management circuit 1002 adjusts the operation mode of the erase operation for the first physical unit. In addition, if the first wear degree value does not conform to the default wear degree value, the memory management circuit 1002 determines that the first use state does not conform to the first default state.

In another exemplary embodiment, the first use state also refers to a programming mode of the first physical unit. For example, the programming mode of one physical unit includes a first programming mode and a second programming mode. The first programming mode is also called a multi-layer memory cell mode. If a rewritable non-volatile memory module 106 is used in the first programming mode, each memory cell stores a first number of bits of data, wherein the first number is not less than 2. The first number is 2 or 3, for example. The second programming mode includes at least one of the following: a single-layer memory cell mode (SLC mode), a lower physical programming unit programming mode, a mixture programming mode, and a few-layer memory cell mode. If the rewritable non-volatile memory module 106 is used in the single-layer memory cell mode, each memory cell stores only one bit of data. If the rewritable non-volatile memory module 106 is used in the lower physical programming unit programming mode, only the physical programming unit that belongs to the lower physical programming unit in the rewritable non-volatile memory module 106 is programmed, and the upper physical programming unit corresponding to the lower physical programming unit may not be programmed. If the rewritable non-volatile memory module 106 is used in the mixture programming mode, valid data (or true data) is programmed to the physical programming unit that belongs to the lower physical programming unit, not to the physical programming unit that belongs to the upper physical programming unit. Further, if the rewritable non-volatile memory module 106 is used in the mixture programming mode, invalid data (or virtual data) corresponding to the valid data (or true data) is programmed to the physical programming unit that belongs to the upper physical programming unit. If the rewritable non-volatile memory module 106 is used in the few-layer memory cell mode, each memory cell stores a second number of bits of data, wherein the second number is smaller than the first number. The second number is 1 or 2, for example. In particular, for physical programming units that use different modes of the second programming mode, the programmed memory cells may have different threshold voltage distributions.

Generally, if the wear degree of one certain physical unit increases, the programming mode of this physical unit may be switched from using the first programming mode to the second programming mode to improve reliability of this physical unit. Improvement of the reliability of the physical unit may be deemed as reduction of the probability of storing erroneous data in the memory cells of the physical unit. In other words, if one certain physical unit is first operated in the first programming mode and then switched to the second programming mode to reduce the number of bits of data stored in the memory cells, it is very possible that the wear degree of this physical unit is high.

In an exemplary embodiment, the memory management circuit 1002 detects the programming mode of the first physical unit and determines whether the first physical unit is switched from using the first programming mode to the second programming mode. If the first physical unit is switched from using the first programming mode to the second programming mode, it indicates that the wear degree of this physical unit may be excessively high. Thus, the memory management circuit 1002 determines that the first use state conforms to the first default state, and in response thereto, executes the aforementioned operation to adjust the operation mode of the erase operation of the first physical unit. However, if the first physical unit remains using the first programming mode, the memory management circuit 1002 determines that the first use state does not conform to the first default state.

It may be noted that, in another exemplary embodiment, the wear degree and the programming mode of the first physical unit are simultaneously used as the basis for determining whether to change the operation mode of the erase operation of the first physical unit. For example, the erase operation of the first physical unit is switched from using the first mode to the second mode only if the wear degree of the first physical unit conforms to the default wear degree value and the first physical unit is switched from using the first programming mode to the second programming mode.

Several exemplary embodiments of adjusting the operation mode of the erase operation are provided below. Here, an extent of adjusting the operation mode of the erase operation may be determined based on a preset adjustment rule or the detected wear degree of the physical unit (or the wear degree value). The invention is not intended to limit the basis for the adjustment.

In an exemplary embodiment, the memory management circuit 1002 reduces the incremental step pulse erase increment value that is to be used for the incremental step pulse erase model of the first physical unit. For example, in FIG. 12, the incremental step pulse erase increment value $\Delta V$ is adjusted from a first increment value that is currently used to a second increment value, wherein the second increment value is smaller than the first increment value. A difference between the first increment value and the second increment value may be preset or determined dynamically according to the first wear degree value of the first physical unit. For example, the difference between the first increment value and the second increment value may be positively correlated to the wear degree of the first physical unit. In other words, the difference between the first increment value and the second increment value increases as the wear degree of the first physical unit increases.

In an exemplary embodiment, the memory management circuit 1002 reduces the voltage value of the initial erase pulse (also called an initial erase voltage value) that is to be used for the incremental step pulse erase model of the first physical unit. For example, in FIG. 12, the voltage value of the erase pulse $V_{E1}$ is adjusted from a first initial erase voltage value that is currently used to a second initial erase voltage value, wherein the second initial erase voltage value is smaller than the first initial erase voltage value. A difference between the first initial erase voltage value and the second initial erase voltage value may be preset or determined dynamically according to the first wear degree value of the first physical unit. For example, the difference between the first initial erase voltage value and the second initial erase voltage value may be positively correlated to the wear degree of the first physical unit. In other words, the difference between the first initial erase voltage value and the second initial erase voltage value increases as the wear degree of the first physical unit increases.

In an exemplary embodiment, the memory management circuit 1002 reduces a width of the erase pulse (also called an erase pulse width value) that is to be used for the incremental step pulse erase model of the first physical unit. For example, in FIG. 12, an erase pulse width value W is adjusted from a first pulse width value that is currently used to a second pulse width value, wherein the second pulse width value is smaller than the first pulse width value. A difference between the first pulse width value and the second pulse width value may be preset or determined dynamically according to the first wear degree value of the first physical unit. For example, the difference between the first pulse width value and the second pulse width value may be positively correlated to the wear degree of the first physical unit. In other words, the difference between the first pulse width value and the second pulse width value increases as the wear degree of the first physical unit increases.

In an exemplary embodiment, the memory management circuit 1002 increases an upper limit of the erase-verification cycles to be used for the incremental step pulse erase model of the first physical unit. For example, in FIG. 12, the maximum cycle number of the erase-verification cycles including the erase-verification cycles loop1-loop3 is adjusted from a first cycle number that is currently used to a second cycle number, wherein the second cycle number is greater than the first cycle number. A difference between the first cycle number and the second cycle number may be preset or determined dynamically according to the first wear degree value of the first physical unit. For example, the difference between the first cycle number and the second cycle number may be positively correlated to the wear degree of the first physical unit. In other words, the difference between the first cycle number and the second cycle number increases as the wear degree of the first physical unit increases.

In an exemplary embodiment, the memory management circuit 1002 raises a voltage value (also called a source voltage value) of a source voltage that is to be provided by a source line coupled to the first physical unit in the erase operation of the first physical unit. For example, in the exemplary embodiment of FIG. 9, the source voltage value of the source voltage provided to the physical erase unit 408(0) through the source line 610 is adjusted from a first source voltage value that is currently used to a second source voltage value, wherein the second source voltage value is greater than the first source voltage value. A difference between the first source voltage value and the second source voltage value may be preset or determined dynamically according to the first wear degree value of the first physical unit. For example, the difference between the first source voltage value and the second source voltage value may be positively correlated to the wear degree of the first physical unit. In other words, the difference between the first source voltage value and the second source voltage value increases as the wear degree of the first physical unit increases. It may be noted that, in another exemplary embodiment, for different uses/conditions, the memory management circuit 1002 may reduce the source voltage value (i.e. the second source voltage value is smaller than the first source voltage value) that is to be provided by the source line coupled to the first physical unit in the erase operation of the first physical unit.

In an exemplary embodiment, the memory management circuit 1002 reduces a voltage value of the verification pulse (also called an erase verification voltage value) that is to be used for the incremental step pulse erase model of the first physical unit. For example, in FIG. 12 and FIG. 13, the erase verification voltage value of the verification pulse $V_{EVerify1}$ is adjusted from a first erase verification voltage value that is currently used to a second erase verification voltage value, wherein the second erase verification voltage value is smaller than the first erase verification voltage value. A difference between the first erase verification voltage value and the second erase verification voltage value may be preset or determined dynamically according to the first wear degree value of the first physical unit. For example, the difference between the first erase verification voltage value and the second erase verification voltage value may be positively correlated to the wear degree of the first physical unit. In other words, the difference between the first erase verification voltage value and the second erase verification voltage value increases as the wear degree of the first physical unit increases. In this exemplary embodiment, the source voltage value and the erase verification voltage value are negatively correlated. For example, the erase verification voltage value that is used is correspondingly decreased in response to the increase of the source voltage value that is used; the erase verification voltage value that is used is correspondingly increased in response to the decrease of the source voltage value that is used; the source voltage value that is used is correspondingly decreased in response to the increase of the erase verification voltage value that is used; and the source voltage value that is used is correspondingly increased in response to the decrease of the erase verification voltage value that is used. That is to say, the second erase verification voltage value may be greater than the first erase verification voltage value depending on different uses/conditions. Further, in another exemplary embodiment, the configuring of the source voltage value may be irrelevant to the configuring of the erase verification voltage value.

It should be mentioned that the invention is not intended to limit whether the erase parameters adjusted in the above exemplary embodiments are used solely or at least partially in combination. In addition, the invention is not limited to any of the above exemplary embodiments. In other exemplary embodiments, any parameter that can be used for narrowing the threshold voltage distribution of the memory cells in the erase operation may be adjusted. Furthermore, for certain special application, the adjustment of part of the erase parameters may be different from or contrary to the disclosure of the above exemplary embodiments. For example, in an exemplary embodiment, in response to a special use state of one certain physical unit, the voltage value of the source voltage provided in the erase operation of the physical unit may be reduced.

According to the above exemplary embodiments, the operation modes of the erase operations for different physical units in the rewritable non-volatile memory module 406 may differ. For example, some physical units may use the default operation mode of the erase operation while other physical units use the adjusted operation mode of the erase operation. In addition, since the number of times of adjusting the erase operation for different physical units and/or the wear degrees of different physical units may be different, the operation modes of the erase operation for these physical units may also differ. Details regarding how to adjust the operation mode of the erase operation have been specified above and therefore are not repeated hereinafter.

Figure 14:
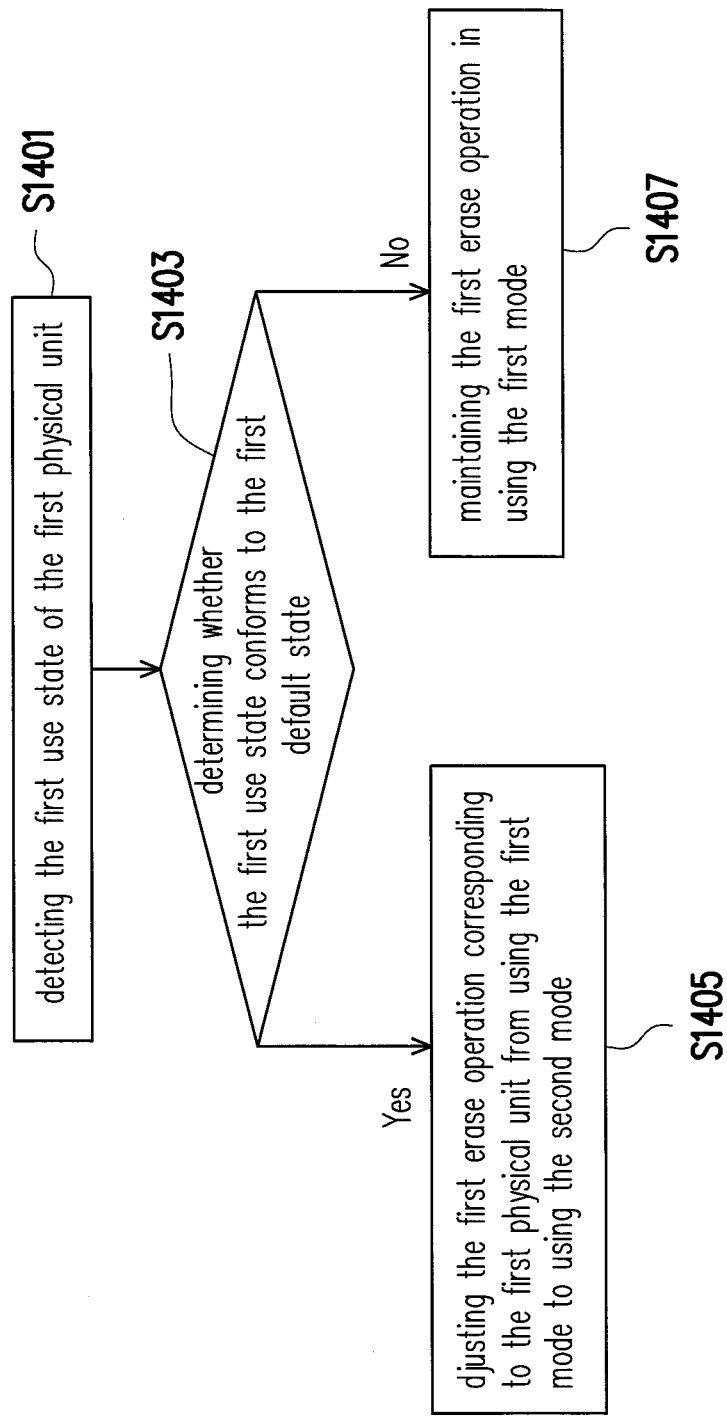
FIG. 14 is a flowchart showing a configuration method of erase operation according to an exemplary embodiment of the invention.

FIG. 14 is a flowchart showing a configuration method of erase operation according to an exemplary embodiment of the invention.

With reference to FIG. 14, in Step S1401, the first use state of the first physical unit is detected. In Step S1403, whether the first use state conforms to the first default state is determined. If the first use state conforms to the first default state, in Step S1405, the first erase operation corresponding to the first physical unit is adjusted from using the first mode to the second mode. If the first use state does not conform to the first default state, in Step S1407, the first erase operation is maintained to use the first mode.

Details of each step of FIG. 14 have been specified above and thus are not repeated hereinafter. It may be noted that each step of FIG. 14 may be implemented as a plurality of program codes or circuits, and the invention is not intended to limit how each step is implemented. In addition, the method of FIG. 14 may be used in combination with the above-described exemplary embodiments or be used solely. Nevertheless, the invention is not limited thereto.

To conclude the above, the configuration method of erase operation and the memory controlling circuit unit and the memory storage device using the method according to the invention can adjust the operation mode of the corresponding erase operation based on the wear degree of the physical units in the rewritable non-volatile memory module. Thereby, the invention may adjust the threshold voltage distribution of the memory cells in the erase state to an appropriate range, so as to reduce the probability of reading erroneous data when reading data from the memory cells and/or preventing increase of the time required for programming the memory cells.

The previously described exemplary embodiments of the present disclosure have the advantages aforementioned, wherein the advantages aforementioned not required in all versions of the disclosure.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A configuration method of erase operation for a rewritable non-volatile memory module comprising a plurality of physical units, the configuration method of erase operation comprising:

determining whether a first use state of a first physical unit of the physical units conforms to a first default state;

adjusting a first erase operation corresponding to the first physical unit from using a first mode to a second mode if the first use state conforms to the first default state, wherein the first mode and the second mode are different; and maintaining the first erase operation in using the first mode if the first use state does not conform to the first default state.

2. The configuration method of erase operation according to claim 1, wherein the step of determining whether the first use state of the first physical unit of the physical units conforms to the first default state comprises:

determining whether a first wear degree value of the first physical unit conforms to a default wear degree value, wherein the first wear degree value is related to at least one of an erase count of the first physical unit, a programming count of the first physical unit, a reading count of the first physical unit, an error bit number of the first physical unit, and an error bit rate of the first physical unit.

3. The configuration method of erase operation according to claim 1, wherein the step of determining whether the first use state of the first physical unit of the physical units conforms to the first default state comprises:
determining whether the first physical unit is switched from using a first programming mode to a second programming mode, wherein a first memory cell of the first physical unit stores first bit data of a first number in the first programming mode, and the first memory cell of the first physical unit stores second bit data of a second number in the second programming mode, wherein the first number is greater than the second number.

4. The configuration method of erase operation according to claim 1, wherein the first erase operation is executed based on an incremental step pulse erase model, and the step of adjusting the first erase operation corresponding to the first physical unit from using the first mode to the second mode comprises:
adjusting an incremental step pulse erase increment value of the incremental step pulse erase model from a first increment value to a second increment value, wherein the second increment value is smaller than the first increment value.

5. The configuration method of erase operation according to claim 1, wherein the first erase operation is executed based on an incremental step pulse erase model, and the step of adjusting the first erase operation corresponding to the first physical unit from using the first mode to the second mode comprises:
adjusting an initial erase pulse voltage value of the incremental step pulse erase model from a first initial erase voltage value to a second initial erase voltage value, wherein the second initial erase voltage value is smaller than the first initial erase voltage value.

6. The configuration method of erase operation according to claim 1, wherein the first erase operation is executed based on an incremental step pulse erase model, and the step of adjusting the first erase operation corresponding to the first physical unit from using the first mode to the second mode comprises:
adjusting an erase pulse width value of the incremental step pulse erase model from a first pulse width value to a second pulse width value, wherein the second pulse width value is smaller than the first pulse width value.

7. The configuration method of erase operation according to claim 1, wherein the first erase operation is executed based on an incremental step pulse erase model, and the incremental step pulse erase model comprises a plurality of erase-verification cycles, each of the erase-verification cycles comprises an erase pulse and a verification pulse, and the step of adjusting the first erase operation corresponding to the first physical unit from using the first mode to the second mode comprises:
adjusting a maximum cycle number of the erase-verification cycles from a first cycle number to a second cycle number, wherein the second cycle number is greater than the first cycle number.

8. The configuration method of erase operation according to claim 1, wherein the first physical unit comprises a plurality of bit lines and a source line for providing a source voltage in the first erase operation, wherein each of the bit lines is coupled to the source line, and the step of adjusting the first erase operation corresponding to the first physical unit from using the first mode to the second mode comprises:
adjusting the source voltage provided by the source line in the first erase operation from a first source voltage value to a second source voltage value, wherein the second source voltage value and the first source voltage value are different.

9. The configuration method of erase operation according to claim 8, wherein the step of adjusting the first erase operation corresponding to the first physical unit from using the first mode to the second mode further comprises:
adjusting an erase verification voltage value of the first erase operation from a first erase verification voltage value to a second erase verification voltage value, wherein the second erase verification voltage value and the first erase verification voltage value are different.

10. A memory storage device, comprising:
a connection interface unit, configured to couple to a host system;
a rewritable non-volatile memory module comprising a plurality of physical units; and
a memory controlling circuit unit, coupled to the connection interface unit and the rewritable non-volatile memory module,
wherein the memory controlling circuit unit is configured to determine whether a first use state of a first physical unit of the physical units conforms to a first default state,
wherein the memory controlling circuit unit is further configured to transmit an erase mode adjustment command if the first use state conforms to the first default state, wherein the erase mode adjustment command instructs to adjust a first erase operation corresponding to the first physical unit from using a first mode to a second mode, wherein the first mode and the second mode are different,
wherein the memory controlling circuit unit is further configured to maintain the first erase operation in using the first mode if the first use state does not conform to the first default state.

11. The memory storage device according to claim 10, wherein the operation that the memory controlling circuit unit determines whether the first use state of the first physical unit of the physical units conforms to the first default state comprises:
determining whether a first wear degree value of the first physical unit conforms to a default wear degree value, wherein the first wear degree value is related to at least one of an erase count of the first physical unit, a programming count of the first physical unit, a reading count of the first physical unit, an error bit number of the first physical unit, and an error bit rate of the first physical unit.

12. The memory storage device according to claim 10, wherein the operation that the memory controlling circuit unit determines whether the first use state of the first physical unit of the physical units conforms to the first default state comprises:
determining whether the first physical unit is switched from using a first programming mode to a second programming mode, wherein a first memory cell of the first physical unit stores first bit data of a first number in the first programming mode, and the first memory cell of the first physical unit stores second bit data of a second number in the second programming mode, wherein the first number is greater than the second number.

13. The memory storage device according to claim 10, wherein the first erase operation is executed based on an incremental step pulse erase model, and the operation that the memory controlling circuit unit adjusts the first erase operation corresponding to the first physical unit from using the first mode to the second mode comprises:

adjusting an incremental step pulse erase increment value of the incremental step pulse erase model from a first increment value to a second increment value, wherein the second increment value is smaller than the first increment value.

14. The memory storage device according to claim 10, wherein the first erase operation is executed based on an incremental step pulse erase model, and the operation that the memory controlling circuit unit adjusts the first erase operation corresponding to the first physical unit from using the first mode to the second mode comprises:

adjusting an initial erase pulse voltage value of the incremental step pulse erase model from a first initial erase voltage value to a second initial erase voltage value, wherein the second initial erase voltage value is smaller than the first initial erase voltage value.

15. The memory storage device according to claim 10, wherein the first erase operation is executed based on an incremental step pulse erase model, and the operation that the memory controlling circuit unit adjusts the first erase operation corresponding to the first physical unit from using the first mode to the second mode comprises:

adjusting an erase pulse width value of the incremental step pulse erase model from a first pulse width value to a second pulse width value, wherein the second pulse width value is smaller than the first pulse width value.

16. The memory storage device according to claim 10, wherein the first erase operation is executed based on an incremental step pulse erase model, and the incremental step pulse erase model comprises a plurality of erase-verification cycles, each of the erase-verification cycles comprises an erase pulse and a verification pulse, and the operation that the memory controlling circuit unit adjusts the first erase operation corresponding to the first physical unit from using the first mode to the second mode comprises:

adjusting a maximum cycle number of the erase-verification cycles from a first cycle number to a second cycle number, wherein the second cycle number is greater than the first cycle number.

17. The memory storage device according to claim 10, wherein the first physical unit comprises a plurality of bit lines and a source line for providing a source voltage in the first erase operation, wherein each of the bit lines is coupled to the source line, and the operation that the memory controlling circuit unit adjusts the first erase operation corresponding to the first physical unit from using the first mode to the second mode comprises:

adjusting the source voltage provided by the source line in the first erase operation from a first source voltage value to a second source voltage value, wherein the second source voltage value and the first source voltage value are different.

18. The memory storage device according to claim 17, wherein the operation that the memory controlling circuit unit adjusts the first erase operation corresponding to the first physical unit from using the first mode to the second mode further comprises:

adjusting an erase verification voltage value of the first erase operation from a first erase verification voltage value to a second erase verification voltage value, wherein the second erase verification voltage value and the first erase verification voltage value are different.

19. A memory controlling circuit unit for controlling a rewritable non-volatile memory module comprising a plurality of physical units, the memory controlling circuit unit comprising:

a host interface, configured to couple to a host system;

a memory interface, configured to couple to the rewritable non-volatile memory module; and a memory management circuit, coupled to the host interface and the memory interface, wherein the memory management circuit is configured to determine whether a first use state of a first physical unit of the physical units conforms to a first default state, wherein the memory management circuit is further configured to transmit an erase mode adjustment command if the first use state conforms to the first default state, wherein the erase mode adjustment command instructs to adjust a first erase operation corresponding to the first physical unit from using a first mode to a second mode, wherein the first mode and the second mode are different, wherein the memory management circuit is further configured to maintain the first erase operation in using the first mode if the first use state does not conform to the first default state.

20. The memory controlling circuit unit according to claim 19, wherein the first erase operation is executed based on an incremental step pulse erase model, and the operation that the memory management circuit adjusts the first erase operation corresponding to the first physical unit from using the first mode to the second mode comprises:

adjusting an incremental step pulse erase increment value of the incremental step pulse erase model from a first increment value to a second increment value, wherein the second increment value is smaller than the first increment value.

21. The memory controlling circuit unit according to claim 19, wherein the first erase operation is executed based on an incremental step pulse erase model, and the operation that the memory management circuit adjusts the first erase operation corresponding to the first physical unit from using the first mode to the second mode comprises:

adjusting an initial erase pulse voltage value of the incremental step pulse erase model from a first initial erase voltage value to a second initial erase voltage value, wherein the second initial erase voltage value is smaller than the first initial erase voltage value.

22. The memory controlling circuit unit according to claim 19, wherein the first erase operation is executed based on an incremental step pulse erase model, and the operation that the memory management circuit adjusts the first erase operation corresponding to the first physical unit from using the first mode to the second mode comprises:

adjusting an erase pulse width value of the incremental step pulse erase model from a first pulse width value to a second pulse width value, wherein the second pulse width value is smaller than the first pulse width value.

23. The memory controlling circuit unit according to claim 19, wherein the first erase operation is executed based on an incremental step pulse erase model, and the incremental step pulse erase model comprises a plurality of erase-verification cycles, each of the erase-verification cycles comprises an erase pulse and a verification pulse, and the operation that the memory management circuit adjusts the first erase operation corresponding to the first physical unit from using the first mode to the second mode comprises:

adjusting a maximum cycle number of the erase-verification cycles from a first cycle number to a second cycle number, wherein the second cycle number is greater than the first cycle number.

24. The memory controlling circuit unit according to claim 19, wherein the first physical unit comprises a plurality of bit lines and a source line for providing a source voltage in the first erase operation, wherein each of the bit lines is coupled to the source line, and the operation that the memory management circuit adjusts the first erase operation corresponding to the first physical unit from using the first mode to the second mode comprises:

adjusting the source voltage provided by the source line in the first erase operation from a first source voltage value to a second source voltage value, wherein the second source voltage value and the first source voltage value are different.

25. The memory controlling circuit unit according to claim 24, wherein the operation that the memory management circuit adjusts the first erase operation corresponding to the first physical unit from using the first mode to the second mode further comprises:

adjusting an erase verification voltage value of the first erase operation from a first erase verification voltage value to a second erase verification voltage value, wherein the second erase verification voltage value and the first erase verification voltage value are different.

\* \* \* \* \*